(12) United States Patent
Mysore Rajagopal et al.

(10) Patent No.: US 11,107,806 B2
(45) Date of Patent: Aug. 31, 2021

(54) ELECTROSTATIC DISCHARGE PROTECTION CIRCUIT

(71) Applicant: Texas Instruments Incorporated, Dallas, TX (US)

(72) Inventors: Krishna Praveen Mysore Rajagopal, Santa Clara, CA (US); Mariano Dissegna, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 91 days.

(21) Appl. No.: 16/393,850

(22) Filed: Apr. 24, 2019

(65) Prior Publication Data

US 2020/0343239 A1 Oct. 29, 2020

(51) Int. Cl.
| | | |
|---|---|---|
| *H01L 27/02* | (2006.01) | |
| *H01L 27/06* | (2006.01) | |
| *H02H 9/04* | (2006.01) | |
| *H01L 29/80* | (2006.01) | |
| *H01L 29/78* | (2006.01) | |
| *H01L 49/02* | (2006.01) | |

(52) U.S. Cl.
CPC ...... *H01L 27/0266* (2013.01); *H01L 27/0629* (2013.01); *H02H 9/046* (2013.01); *H01L 28/20* (2013.01); *H01L 29/78* (2013.01); *H01L 29/80* (2013.01)

(58) Field of Classification Search
CPC .......................... H01L 27/0266; H01L 27/062

USPC ......................................................... 257/262
See application file for complete search history.

(56) References Cited

U.S. PATENT DOCUMENTS

| | | | |
|---|---|---|---|
| 9,130,562 B2* | 9/2015 | Mallikarjunaswamy | ..................... H02H 9/046 |
| 2008/0238522 A1* | 10/2008 | Thorp | ............... H03K 3/356182 327/333 |
| 2008/0238523 A1* | 10/2008 | Thorp | ................ H03K 3/35613 327/333 |
| 2018/0175020 A1 | 6/2018 | Dissegna | |
| 2019/0096874 A1 | 3/2019 | Rajagopal et al. | |
| 2020/0343239 A1* | 10/2020 | Mysore Rajagopal | ...................... H01L 27/0266 |

\* cited by examiner

*Primary Examiner* — Jami Valentine Miller
(74) *Attorney, Agent, or Firm* — Andrew R. Ralston; Charles A. Brill; Frank D. Cimino

(57) ABSTRACT

Described examples include an integrated circuit includes a protected node and a first transistor having a source coupled to the protected node, a gate and a drain coupled to a ground, wherein the first transistor is a MOSFET transistor. The integrated circuit also includes a second transistor having a first current handling terminal coupled to the protected node, a second current handling terminal coupled to the ground and a control terminal coupled to a reference potential, where the second transistor is configured to be off when a first voltage on the control terminal of the second transistor is less than a second voltage on the first current handling terminal of the second transistor.

18 Claims, 3 Drawing Sheets

ELECTROSTATIC DISCHARGE PROTECTION CIRCUIT

TECHNICAL FIELD

This relates generally to integrated circuit protection, and in particular examples to electrostatic discharge protection of integrated circuits.

BACKGROUND

Many integrated circuit devices are susceptible to damage by electrostatic discharge (ESD). One source of discharge is static electricity built up in the human body that is discharged when handling the integrated circuit. To protect the delicate elements of the integrated circuit, ESD protection circuits are often implemented at the input/output (I/O) pads of integrated circuits. One such ESD protection circuit is a "snapback" device. Snapback devices include a metal-oxide field-effect transistor (MOSFET) with its source coupled to the protected pad and its drain coupled to ground. The snapback effect relies on a parasitic bipolar transistor of the MOSFET. The parasitic bipolar transistor is formed by the source, which is the collector of the parasitic transistor, the channel region, which is the base of the parasitic transistor, and the drain, which is the emitter of the parasitic transistor.

ESD events involve very high voltages for a very short time. With a snapback device, this voltage is applied to the source of the MOSFET. The very high voltage causes an avalanche breakdown at the junction between the source and the channel region of the MOSFET. The breakdown injects current into the channel region, which is the base of parasitic transistor. This injected current turns on the parasitic bipolar transistor, which dissipates the ESD to ground. The parasitic transistor will remain on so long as a holding current is flowing through the parasitic transistor. However, when the current through the transistor falls below the holding current, the parasitic bipolar transistor shuts off. Enough charge from the ESD may be remain on the I/O pad such that the voltage on the I/O pad is too high for sensitive devices on the integrated circuit. Thus, although the snapback device has dissipated most of the charge of the ESD, enough charge may remain when the parasitic transistor turns off to damage sensitive devices on the integrated circuit.

SUMMARY

In accordance with an example, an integrated circuit includes a protected node and a first transistor having a source coupled to the protected node, a gate and a drain coupled to a ground, wherein the first transistor is a MOSFET transistor. The integrated circuit also includes a second transistor having a first current handling terminal coupled to the protected node, a second current handling terminal coupled to ground and a control terminal coupled to a reference potential, where the second transistor is configured to be off when a first voltage on the control terminal of the second transistor is less than a second voltage on the first current handling terminal of the second transistor.

DETAILED DESCRIPTION

Figure 1:
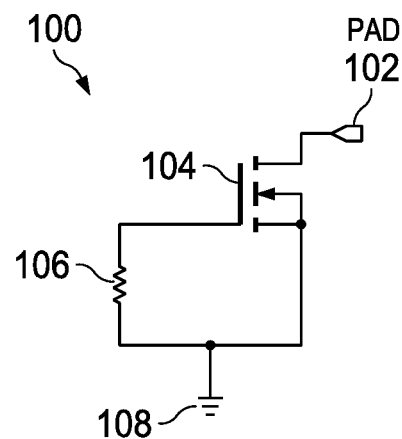
FIG. 1 is a circuit diagram of an ESD protection circuit.

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled."

Examples described hereinbelow prevent over-voltage conditions on a node protected from ESD by a snapback device by using a second transistor coupled between the protected node and a path to ground where the control terminal of the second transistor is biased such that the second transistor is only on when the voltage on the protected node is higher than a selected voltage. In an example, the second transistor is a junction field-effect transistor with its gate coupled to the supply voltage or Vdd of the integrated circuit. In this example, the second transistor is a p-type junction FET, and thus is off when its source voltage is less than the selected voltage applied to the gate of the second transistor. After the snapback device has dissipated most of an ESD, if the voltage on the pad is higher than the bias voltage on the gate of the second transistor, the second transistor remains on and dissipates the remaining charge until the pad voltage is lower than the bias voltage. In an example, the drain of the second transistor is coupled to the gate of the snapback MOSFET, thus when the second transistor is on, the high voltage on the pad is applied to the gate of the MOSFET. This turns on the MOSFET and provides an additional path to dissipate the charge on the pad.

FIG. 1 is a circuit diagram of an ESD protection circuit 100. Pad 102 is the protected node of the integrated circuit and is coupled to sensitive circuitry (not shown). Pad 102 is coupled to the source of MOSFET 104. The drain of MOSFET 104 is coupled to ground 108. The gate of MOSFET 104 is coupled to ground 108 through resistor 106. As explained further hereinbelow, when an ESD is applied to pad 102, the parasitic bipolar transistor of MOSFET 104 turns on to discharge the ESD.

Figure 2:
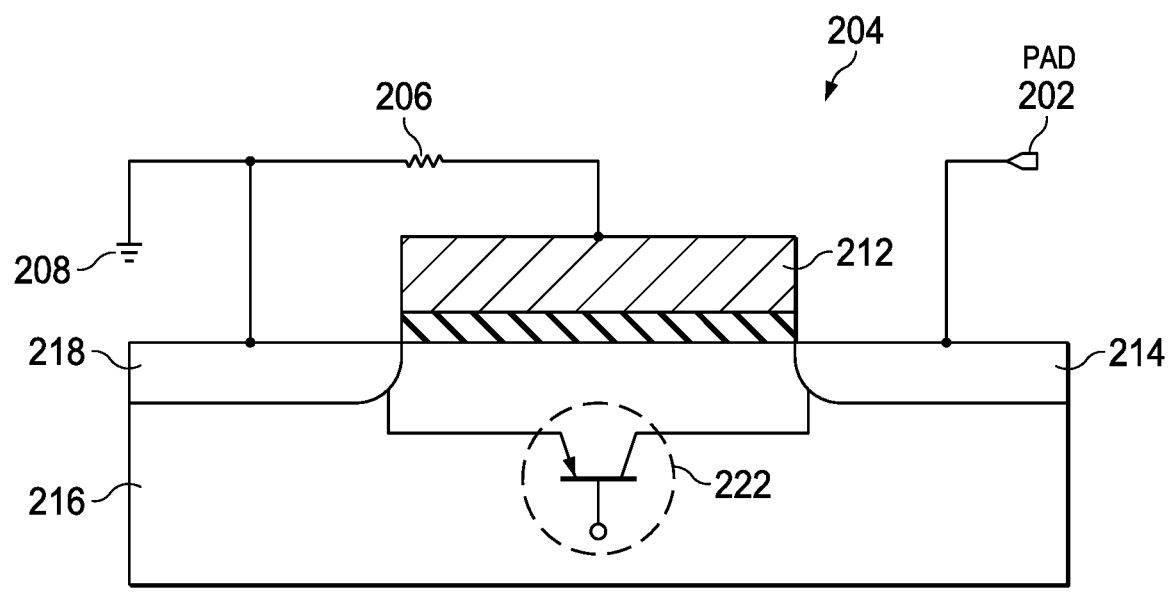
FIG. 2 is a schematic side view of a MOSFET.

FIG. 2 is a schematic side view of a MOSFET 204. MOSFET 204 is like MOSFET 104 (FIG. 1). Pad 202 is coupled to source diffusion 214. Pad 202 is like pad 102 (FIG. 1). Source diffusion 214 is formed in substrate 216 by, for example, ion implantation. Drain diffusion 218 is coupled ground 208. Drain diffusion 218 is formed in substrate 216 by, for example, ion implantation. Ground 208 is like ground 108 (FIG. 1). Source diffusion 214 and drain diffusion 218 are doped to a conductivity opposite to the conductivity of substrate 216. Substrate 216 is a semiconductor that is, for example, a doped epitaxial layer. In this example, MOSFET 204 is an N-channel, enhancement type MOSFET. Therefore, source diffusion 214 and drain diffusion 218 are doped P-type, and substrate 216 is doped N-type. Gate 212 is coupled to ground 208 through resistor 206. Resistor 206 is like resistor 106 (FIG. 1). Parasitic bipolar transistor 222 includes source diffusion 214, which is the collector of parasitic bipolar transistor 222, substrate 216, which is the base of parasitic bipolar transistor 222, and drain diffusion 218, which is the emitter of parasitic bipolar transistor 222.

Figure 3:
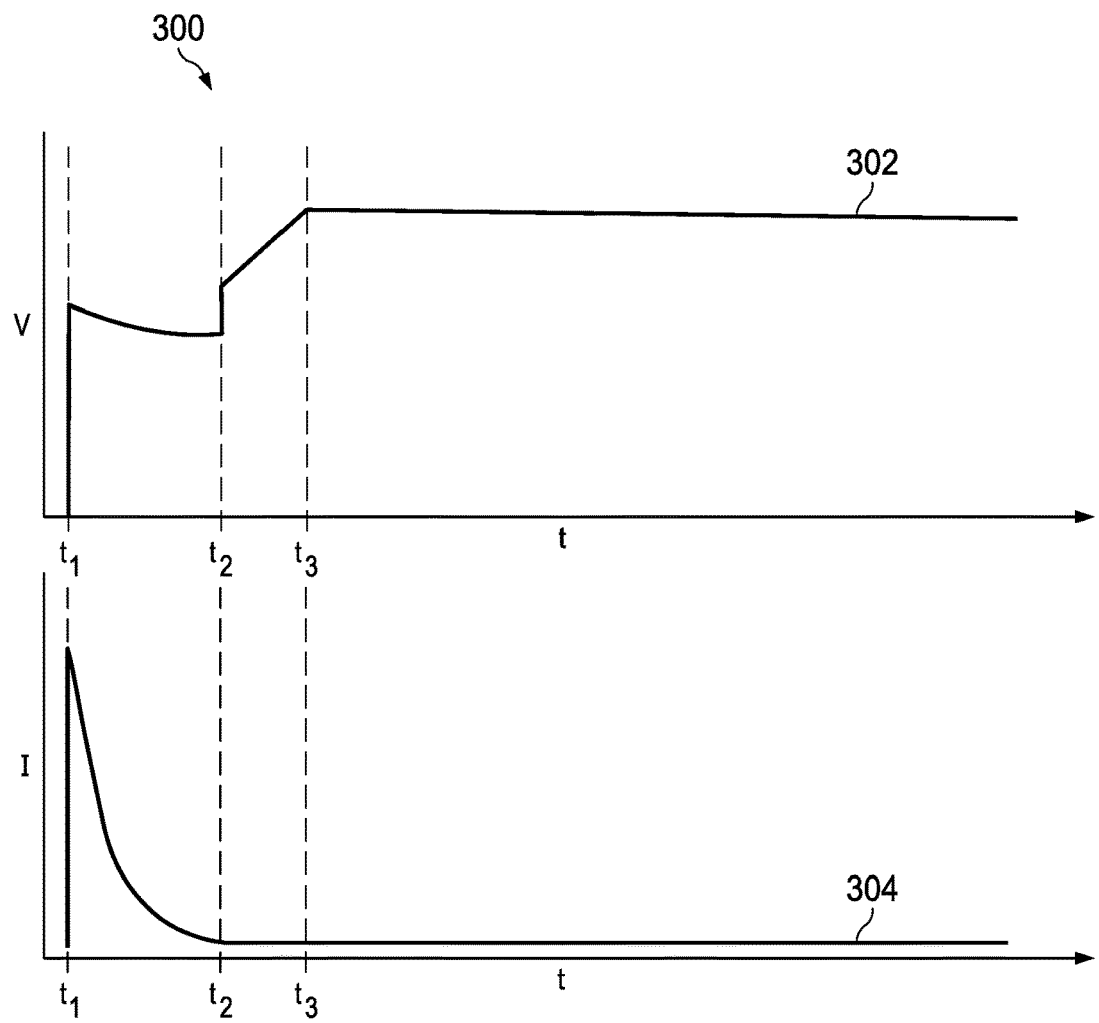
FIG. 3 is two graphs showing the operation of the ESD protection circuit of FIG. 1.

FIG. 3 is two graphs 300 showing the operation of ESD protection circuit 100 (FIG. 1). Trace 302 shows the voltage on pad 102 (FIG. 1) versus time. Trace 304 shows the current through MOSFET 104 (FIG. 1) versus time. At time $t_1$, a Human Body Model (HBM) electrostatic discharge is applied to pad 102 (FIG. 1). The HBM is defined by the ANSI/ESD STM5.5.1-2016 standard. At time $t_1$, the voltage on pad 102 (FIG. 1) rises rapidly until the parasitic bipolar transistor of MOSFET 104 (FIG. 1) turns on as indicated by the current spike through the parasitic bipolar transistor as shown in trace 304. Between times $t_1$ and $t_2$, the voltage on pad 102 (FIG. 1) declines until the current through the parasitic bipolar transistor falls below the holding current necessary to maintain the parasitic bipolar transistor of MOSFET 104 (FIG. 1) in the on state. This occurs at time $t_2$. From time $t_2$, the voltage on pad 102 (FIG. 1) rises to a maximum at time $t_3$ as the impedance of MOSFET 104 (FIG. 1) rises because the parasitic bipolar transistor is shutting off. Depending on the sensitivity of the circuits coupled to pad 102 (FIG. 1) and the voltage level of the ESD, this voltage may be enough to damage sensitive circuits coupled to pad 102 (FIG. 1).

Figure 4:
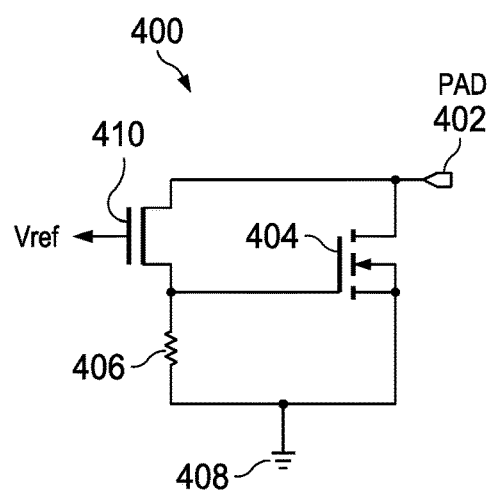
FIG. 4 is a circuit diagram of an example ESD protection circuit.

FIG. 4 is a circuit diagram of an example ESD protection circuit 400. Pad 402 is a protected node coupled to protected circuitry (not shown) other parts of the integrated circuit that includes ESD protection circuit 400. The source or first current handling terminal of MOSFET 404 is coupled to pad 402. The drain or second current handling terminal of MOSFET 404 is coupled to a ground 408. In this example, ground 408 is a potential of zero volts. In another example, ground 408 couples to a potential external to the integrated circuit including ESD protection circuit 400. A first terminal of resistor 406 couples to the gate of MOSFET 404 and a second terminal of resistor 406 couples to ground 408. In this example, MOSFET 404 is an enhancement-type, N-channel MOSFET. The source or first current handling terminal of transistor 410 is coupled to pad 402. The drain or second current handling terminal of transistor 410 is coupled to the gate of MOSFET 404. The gate or control terminal of transistor 410 is coupled to a reference potential Vref. In this example, Vref is Vdd or the highest operating voltage of the protected circuitry (not shown) coupled to pad 402. In this example, transistor 410 is a p-type junction field-effect transistor (JFET). In normal operation, Vref is equal to or higher than the voltage on pad 402. Thus, transistor 410 is off. Because transistor 410 is off, no bias is applied to the gate of MOSFET 404 through transistor 410. Thus, MOSFET 404 is off. Therefore, in normal operation, ESD protection circuit 400 has a high impedance between pad 402 and ground 408, and thus ESD protection circuit 400 does not interfere with the operation of the protected circuitry (not shown) coupled to pad 402.

However, if an ESD occurs on pad 402, such as an HBM discharge, the parasitic bipolar transistor of MOSFET 404 is turned on by avalanche current from the source of MOSFET 404 into the channel region of MOSFET 404. This discharges most of the ESD. In addition, because the voltage on pad 402 is greater than Vref, transistor 410 turns on, applying a high voltage to the gate of MOSFET 404, thus creating a channel region under the gate of MOSFET, which provides an additional path to discharge the ESD. After the current through the parasitic bipolar transistor of MOSFET falls below the holding current, the parasitic bipolar transistor of MOSFET 404 turns off. If the remaining charge from the ESD creates a voltage at pad 402 greater than Vref, transistor 410 remains on. Thus, the remaining charge flows through two pathways. First, some of the remaining charge flows through transistor 410 and resistor 406 to ground 408. Second, the current through resistor 406 provides a gate to drain voltage drop from the gate of MOSFET 404 to the drain of MOSFET 404. This turns on MOSFET 404, and thus additional charge is dissipated through MOSFET 404. These pathways remain on until the voltage on pad 402 is lower than Vref. When the voltage on pad 402 is below Vref, transistor 410 turns off. Because no current flow through transistor 410 at this time, the voltage drop across resistor 406 goes to zero and MOSFET 404 turns off. Thus, ESD protection circuit 400 continues to discharge the ESD after the parasitic bipolar transistor of MOSFET 404 is off to ensure that the voltage at pad 402 is below Vref, and thus is a safe voltage for the protected circuitry (not shown) coupled to pad 402.

Figure 5:
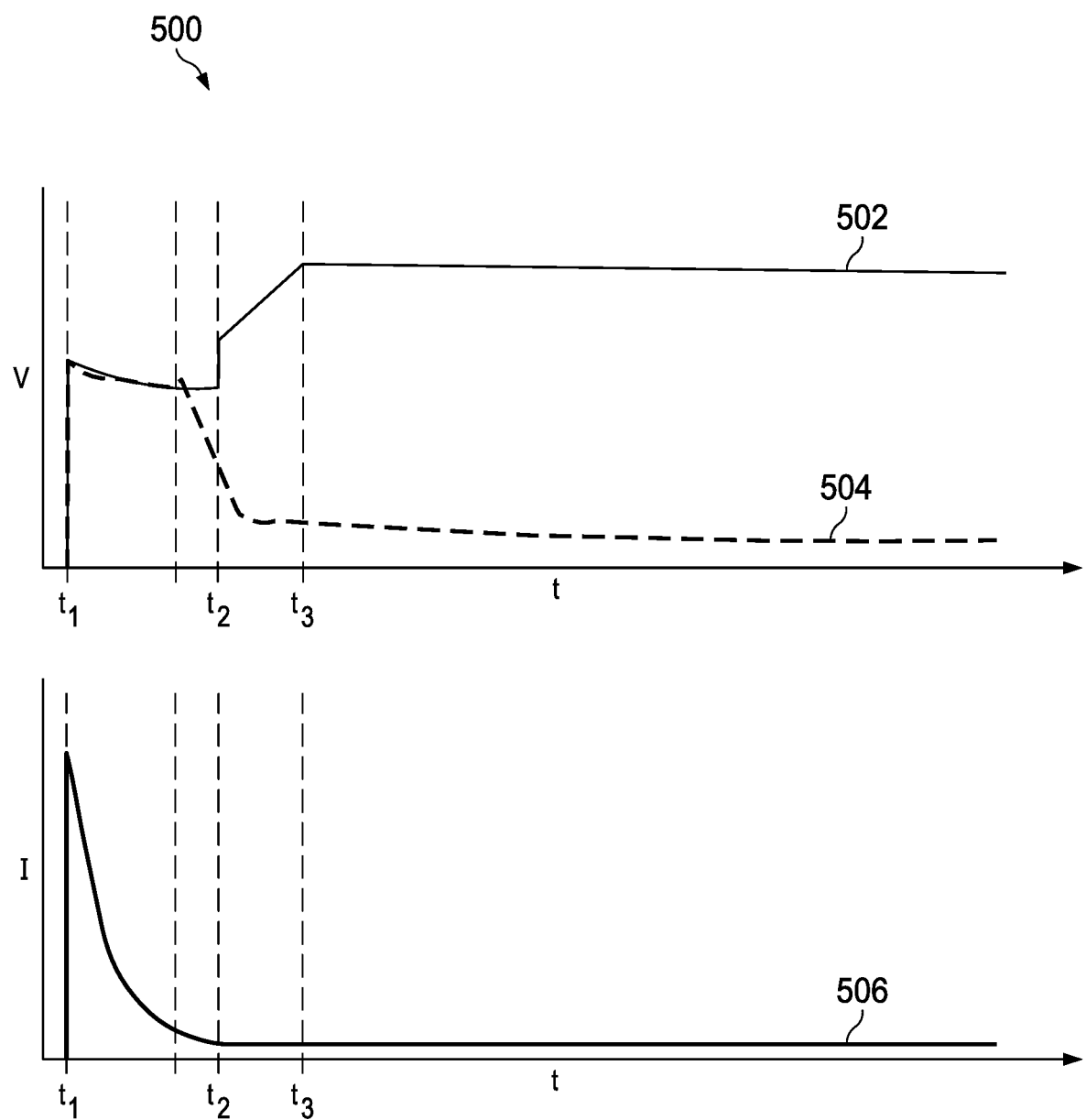
FIG. 5 is two graphs 500 showing the operation of the example ESD protection circuit of FIG. 4.

FIG. 5 is two graphs 500 showing the operation of ESD protection circuit 400 (FIG. 4) as compared to the operation of ESD protection circuit 100 (FIG. 1). Trace 502 shows the voltage of pad 102 (FIG. 1) in response to an HBM ESD. Trace 504 shows the voltage at pad 402 (FIG. 4) in response to a similar HBM ESD. Trace 506 shows the current through MOSFET 104 (FIG. 1) or MOSFET 404 (FIG. 4), which are similar. Trace 502 is like trace 302 (FIG. 3), which is explained hereinabove. Regarding trace 504, at time $t_1$, the voltage on pad 402 (FIG. 4) rises as shown in trace 504. Thus, the ESD causes the parasitic bipolar transistor of MOSFET 404 (FIG. 4) to turn on and the current through the parasitic bipolar transistor of MOSFET 404 (FIG. 4) rises sharply as shown in trace 506. In this example, the voltage on pad 402 is above Vref at $t_1$. Thus, transistor 410 (FIG. 4) turns on at time $t_2$. In this example, transistor 410 is a JFET, and thus is relatively slow. Thus, transistor 410 does not turn on until time $t_2$. At time $t_3$, the parasitic bipolar transistor of MOSFET 104 (FIG. 1) turns off because the current through the parasitic bipolar transistor of MOSFET 104 (FIG. 1) falls below the holding current. Thus, the voltage at pad 102 (FIG. 1) jumps at $t_3$ and rises until $t_4$ as shown in trace 502.

On the other hand, because transistor 410 (FIG. 4) is on, charge continues to be dissipated through transistor 410 (FIG. 4) and MOSFET 404 (FIG. 4) until the voltage on pad 402 (FIG. 4) falls below Vref as shown in trace 504. Therefore, ESD protection circuit 400 (FIG. 4) provides additional protection to the protected circuitry (not shown) coupled to pad 402 (FIG. 4) as opposed to ESD protection circuit 100 (FIG. 1).

Modifications are possible in the described examples, and other examples are possible, within the scope of the claims.

What is claimed is:
1. An integrated circuit comprising:
a protected node;
a first transistor having a drain coupled to the protected node, a gate, and a source coupled to a ground, wherein the first transistor is a MOSFET transistor; and
a junction field-effect transistor (JFET) having a first current handling terminal coupled to the protected node, a second current handling terminal coupled to the gate of the first transistor, and a control terminal coupled to a reference potential, wherein the JFET is configured to be off when a first voltage on the control terminal of the second transistor is less than a second voltage on the first current handling terminal of the second transistor.
2. The integrated circuit of claim 1 wherein the second current handling terminal of the JFET is coupled to a first terminal of a resistor and a second terminal of the resistor is coupled to the ground.

3. The integrated circuit of claim 1, wherein the JFET is a P-type JFET.

4. The integrated circuit of claim 1, wherein the reference potential is Vdd.

5. The integrated circuit of claim 1, wherein the ground is a voltage of zero.

6. The integrated circuit of claim 1, wherein the ground is coupled to a voltage reference external to the integrated circuit.

7. The integrated circuit of claim 1, wherein the first transistor is an N-channel MOSFET.

8. An integrated circuit comprising:
a protected node;
a first transistor having a source coupled to the protected node, a gate, and a drain coupled to a ground, wherein the first transistor is a MOSFET transistor;
a resistor having a first terminal coupled to the gate of the first transistor and a second terminal coupled to the ground; and
a junction field effect transistor (JFET) having a first current handling terminal coupled to the protected node, a second current handling terminal coupled the first terminal of the resistor, and a control terminal coupled to a reference potential, wherein the JFET is configured to be off when a first voltage on the control terminal of the JFET is less than a second voltage on the first current handling terminal of the JFET.

9. The integrated circuit of claim 8, wherein the JFET is a P-type JFET.

10. The integrated circuit of claim 8, wherein the reference potential is Vdd.

11. The integrated circuit of claim 8, wherein the ground is a voltage of zero.

12. The integrated circuit of claim 8, wherein the ground is coupled to a voltage reference external to the integrated circuit.

13. The integrated circuit of claim 8, wherein the first transistor is an N-channel MOSFET.

14. An integrated circuit comprising:
a MOSFET transistor having a first gate, a first drain conductively connected to a protected node, and a first source; and
a junction field-effect transistor (JFET) having a second gate, a second drain conductively connected to the protected node, and a second source conductively connected to the first gate; and
a resistor having a first terminal conductively connected to the second drain and a second terminal conductively connected to the first source.

15. The integrated circuit of claim 14, wherein the second resistor terminal is connected to a ground reference of protected circuitry that includes the protected node.

16. The integrated circuit of claim 14, wherein the first gate is connected to Vdd of protected circuitry that includes the protected node.

17. The integrated circuit of claim 14, wherein the JFET is a p-type JFET.

18. The integrated circuit of claim 14, wherein MOSFET is an n-channel enhancement type MOSFET.

* * * * *